(12) United States Patent  
Lee

(10) Patent No.: US 7,057,950 B2
(45) Date of Patent: Jun. 6, 2006

(54) SEMICONDUCTOR MEMORY DEVICES WITH DELAYED AUTO-PRECHARGE FUNCTION AND ASSOCIATED METHODS OF AUTO-PRECHARGING SEMICONDUCTOR MEMORY DEVICES

(75) Inventor: Dong-Yang Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 12 days.

(21) Appl. No.: 10/706,891

(22) Filed: Nov. 13, 2003

(65) Prior Publication Data

US 2004/0120210 A1  Jun. 24, 2004

(30) Foreign Application Priority Data

Dec. 20, 2002  (KR) .................. 10-2002-0081787

(51) Int. Cl.
  *G11C 7/00*  (2006.01)
(52) U.S. Cl. .................. 365/203; 365/232; 365/230.03
(58) Field of Classification Search ................ 365/232, 365/203, 230.03, 233, 189.01
See application file for complete search history.

(56) References Cited

U.S. PATENT DOCUMENTS

| | | | | |
|---|---|---|---|---|
| 5,566,119 A | * | 10/1996 | Matano | 365/222 |
| 5,636,173 A | * | 6/1997 | Schaefer | 365/230.03 |
| 6,147,916 A | * | 11/2000 | Ogura | 365/203 |
| 6,438,670 B1 | * | 8/2002 | McClannahan | 711/167 |
| 6,559,669 B1 | * | 5/2003 | Sugamoto et al. | 324/763 |
| 6,571,325 B1 | * | 5/2003 | Satagopan et al. | 711/169 |
| 2001/0017805 A1 | * | 8/2001 | Jang et al. | 365/202 |
| 2003/0189870 A1 | * | 10/2003 | Wilcox | 365/233 |

\* cited by examiner

*Primary Examiner*—Richard Elms
*Assistant Examiner*—Dang T. Nguyen
(74) *Attorney, Agent, or Firm*—Myers Bigel Sibley & Sajovec

(57) ABSTRACT

A semiconductor device performs read or write when read or write command with auto-precharge function is input. The semiconductor device does not carry out the auto-precharge operation until a predetermined auto-precharge delay time passes. Therefore, page mode can be performed while using read or write command with auto-precharge function.

21 Claims, 7 Drawing Sheets

SEMICONDUCTOR MEMORY DEVICES WITH DELAYED AUTO-PRECHARGE FUNCTION AND ASSOCIATED METHODS OF AUTO-PRECHARGING SEMICONDUCTOR MEMORY DEVICES

CROSS REFERENCE TO RELATED APPLICATIONS

This application claims priority under 35 U.S.C. § 119 to Korean Patent Application No. 2002-81787, filed Dec. 20, 2002, the contents of which are incorporated herein in its entirety by reference.

FIELD OF THE INVENTION

The present invention relates to semiconductor memory devices and, more particularly, to semiconductor memory devices having an auto-precharge capability.

BACKGROUND OF THE INVENTION

Semiconductor memory devices, such as Dynamic Random Access Memory (DRAM) devices, usually charge bit lines up to a predetermined voltage (e.g., Vcc/2) in order to read or write information from/to a memory cell or to close an activated bank of memory cells. In these devices, before opening a new row of an activated bank, the activated bank should be precharged by way of a precharge function or an auto-precharge command. For instance, the read and write commands of dual data rate synchronomous dynamic random access memory devices (DDR SDRAM) generally automatically precharge the activated bank of memory cells during a burst read cycle or a write cycle by receiving a specific address signal (e.g., a column address A10) in accordance with the timing of a column address strobe (/CAS) signal. If the column address A10 is set to a high level when the read or write command is introduced, an auto-precharge operation begins. A read command assigned to the auto-precharge operation is executed in the same pattern with a normal read command except that the precharge operation starts at a rising edge of the clock cycle of the column address strobe (/CAS) signal prior to the end of the read burst packet. The auto-precharge operation may also be activated by a write-command. The auto-precharge operation may not start until all of the data contained within a burst write sequence is stored in the memory array. The above-described control for initiation of the auto-precharge operation may enhance the asymmetric performance of the device by preventing the burst operation from being disturbed by the precharge operation.

FIG. 1A is a timing diagram showing a conventional read operation of a DDR DRAM device that does not include an auto-precharge capability. To facilitate the explanation of how the device operates, it is assumed that the DDR DRAM operates with a row cycle time $t_{RC}$ of 10 clock cycles ($10*t_{CK}$), a /RAS-to-CAS delay time $t_{RCD}$ of 3 clock cycles ($3*t_{CK}$), and a /CAS latency (CL) of 2 clock cycles ($2*t_{CK}$). In addition, it is assumed that the memory cell array of the DDR DRAM is divided into 4 banks. In FIG. 1A, A0–A3 represent the first through fourth active row commands, R0–R3 represent the first through fourth read commands, and P0–P3 represent the first through fourth precharge commands to the 4 respective banks of the device.

Referring to FIG. 1A, the first active row command A0 is input at clock cycle T0. The read command R0 is then input after $t_{RCD}$ at clock cycle T3. The second active row command A1 is input at clock cycle T2, and then the second read command R1, which corresponds to the second active row command A1, is input after $t_{RCD}$ at clock cycle T5. The third active row command A2 is input at clock cycle T4, and then the corresponding third read command R2 is input after $t_{RCD}$ at clock cycle T7. The fourth active row command A3 is input at clock cycle T6 and, then the corresponding fourth active read command R3 is input after $t_{RCD}$ at clock cycle T9.

As if further shown in FIG. 1A, after the lapse of the two clock cycles (corresponding to CL=2) from the clock cycle at which the first read command R0 is input (i.e., clock cycle T3), a first data bit Q0 is output to a data I/O signal line DQ at clock cycle T5. After two clock cycles (corresponding to CL=2) from the clock cycle T5 at which the second read command R1 is input, a second data bit Q1 is output at clock cycle T7. Similarly, after two clock cycles (corresponding to CL=2) from the clock cycle T7 when the third read command R2 is input, a third data bit Q2 is output at clock cycle T9, and after two clock cycles (corresponding to CL=2) from the clock cycle T9 at which the fourth read command R3 is input, a fourth data bit Q3 is output at clock cycle T11.

After expiration of the row cycle time $t_{RC}$, the first active row command A0 is again input at clock cycle T10. If the column address of the first active row command A0 at clock cycle T0 is different from the column address of the first active row command A0 at clock cycle T10, the first precharge command P0 should be applied before the first active row command A0 is received at clock cycle T10. In FIG. 1A, the first precharge command P0 is input at clock cycle T8. Similarly, if the column address of the second active row command A1 that is input at clock cycle T2 is different from the column address of the second active row command A1 that is input at clock cycle T14, a second precharge command P1 is input at clock cycle T11 before the second row command A1 is received.

As illustrated above, the conventional read operation of a DDR DRAM that does not include an auto-precharge capability uses active row-read-precharge commands. As illustrated in FIG. 1A, this results in idle periods during clock cycles T13–T14 and T17–T18 during which data is not transferred through the bus lines of the memory system. These idle periods generally degrade the transmission efficiency of the device.

Auto-precharge commands have been employed to address this efficiency problem. In particular, a read command that includes an auto-precharge function or capability (hereinafter, referred to as an auto-precharge read command or "RA") or a write command that includes an auto-precharge capability (WA) may be used to carry out the precharge operation after the completion of a read or write operation without the need for a separate precharge command. FIG. 1B is a timing diagram showing the timing for a read operation in a conventional DDR DRAM that includes such an auto-precharge capability.

As shown in FIG. 1B, the first active row command A0 is input at clock cycle T0, and then a first auto-precharge read command RA0 is input after $t_{RCD}$ at clock cycle T3. The second active row command A1 is input at clock cycle T2, and then the second auto-precharge read command RA1 is input after $t_{RCD}$ at clock cycle T5. The third active row command A2 is input at clock cycle T4, and then the third auto-precharge read command RA2 is input after $t_{RCD}$ at clock cycle T7. The fourth active row command A3 is input at clock cycle T6, and then the fourth auto-precharge read command RA3 is input after $t_{RCD}$ at clock cycle T9. After two clock cycles (corresponding to CL=2) from clock cycle T3 at which the first auto-precharge read command RA0 is input, the first data bit Q0 is output at clock cycle T5 to the data I/O signal line DQ. Similarly, two clock cycles after the second auto-precharge read command RA1 is input at clock cycle T5, the second data bit Q1 is output at clock cycle T7. Two clock cycles after clock cycle T7 at which the third auto-precharge read command RA2 is input, the third data bit Q2 is output at clock cycle T9. Two clock cycles after clock cycle T9 at which the fourth auto-precharge read command RA3 is input, the fourth data bit Q3 is output at clock cycle T11.

At clock cycle T3, a corresponding bank is precharged by the first auto-precharge read command RA0. This allows the semiconductor memory device to operate without the need for an additional precharge command in advance of the input of the first active row command A0 at clock cycle T10. As is clear from a comparison of FIGS. 1A and 1B, this can improve the efficiency of the data bus. However, inefficiencies still exist when an auto-precharge read or write command is used because the row that was opened is automatically closed after the read or write operation (i.e., all cells sensed by the active row command). Thus, the active row command should be enabled again in order to access the same row after several clock cycles. As the row is typically not available to conduct a page mode operation that accesses a previously sensed row without a further active row command, the latency time in the memory may be lengthened, degrading the performance efficiency of the memory device.

Analysis of typical data processing programs reveals that there is a tendency for strings of consecutive read and write operations to be concentrated in a localized region of the memory device. This tends to occur because many computer programs employ a large number of program loops and subroutines that are performed in sequential steps. As such, the memory cell that is to be accessed during a read or write operation will, in many instances, comprise a previously accessed memory cell or a memory cell locally adjacent to a previously accessed memory cell. The page mode operation applies cache theory to the operation of the DRAM device. A page of a DRAM device is defined as the number of cells simultaneously selected by one active row command. The size of a page thus may be computed as $2^{row\ address\ bits}*I/O$ bits. Thus, for example, in the case of a DRAM device having 10 row address bits and 8 data pins, the page size (or capacity) is $2^{10}*8=8192$ bits. Therefore, if a specific memory cell within a particular 8192 bit page is accessed, the next memory cell accessed may likely also be another one of the memory cells corresponding to a cell within the 8192 bits. When the page mode is used for a read or write operation, a page opened by an active row command typically maintains its open state without precharging. If the next address for a read or write operation is an address within the already opened page, the read or write operation can be performed without an additional active row command. In this manner, the use of page mode operations may contribute to improved operational performance of the memory device. However, when a conventional DRAM employs the auto-precharge function with the page mode as shown in FIG. 1B, page mode operation may not be available because a page that is opened may be closed after the completion of the read or write operation.

SUMMARY OF THE INVENTION

Methods of precharging a bank in a semiconductor memory device are provided in which a command that includes an auto-precharge function is received by the semiconductor memory device. The received command may be associated with reading data stored on a specific row of the bank. In response to the received command, a timer is initiated, and the bank is automatically precharged responsive to the timer reaches a predetermined value. The timer may be reset if, prior to the timer reaching the predetermined value, a second command is received by the semiconductor memory device that is associated with additional data stored on the specific row of the bank. Alternatively, a precharge command may be issued if prior to the timer reaching the predetermined value a second command is received by the semiconductor memory device that is associated with data stored on a different row of the bank. Further, the specific row of the bank may be left open for a period of time after the operation associated with the command is completed and a second operation may be performed after completion of the first read operation using a page mode operation.

Pursuant to further embodiments of the present invention, method of reading data from a semiconductor memory device are provided in which a read command that includes an auto-precharge function is received by the semiconductor memory device. A first data bit may be read from a cell in a first bank of cells in the semiconductor memory device in response to the read command and a page mode operation may be used to read a second data bit from a second cell in the first bank of cells in response to a subsequent second read command. A timer may also be initiated that measures an auto-precharge delay period in response to receiving the first read command.

Pursuant to additional embodiments of the present invention, semiconductor memory devices are provide that have a memory cell array arranged in rows and columns and a precharge control circuit that is configured to issue a precharge control signal to the memory cell array a predetermined time after a command that activates an auto-precharge function is input to the semiconductor memory device. The precharge control circuit in these devices may further include at least one timer and the precharge control circuit may issue an auto-precharge control signal to the memory cell array when the timer reaches a predetermined delay time.

DESCRIPTION OF THE PREFERRED EMBODIMENT

Figure 1A:
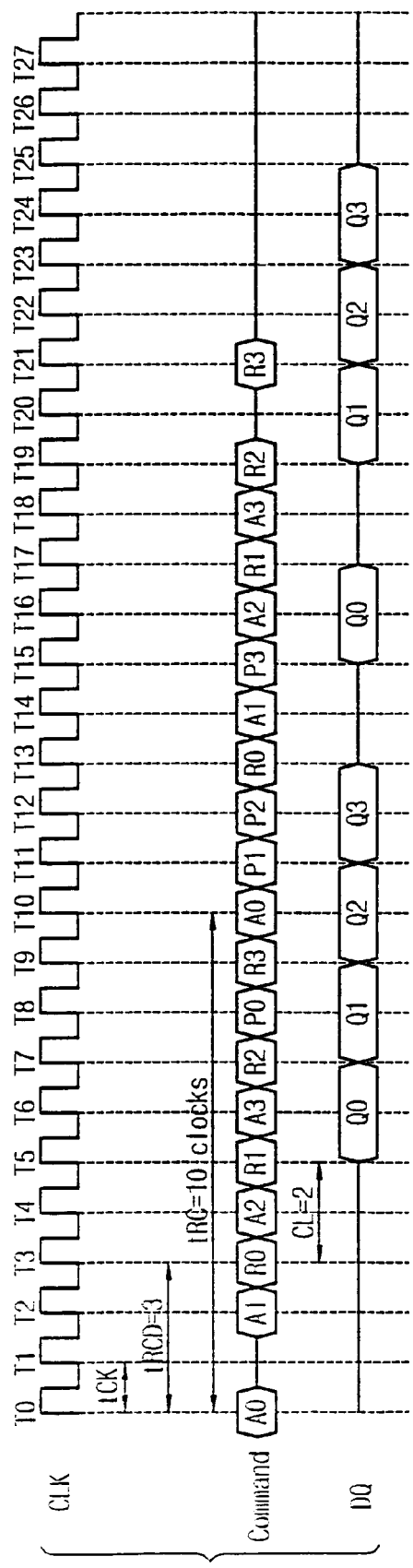
FIG. 1A is a timing diagram showing a conventional read operation that does not include an auto-precharge function in a DDR DRAM.
Figure 1B:
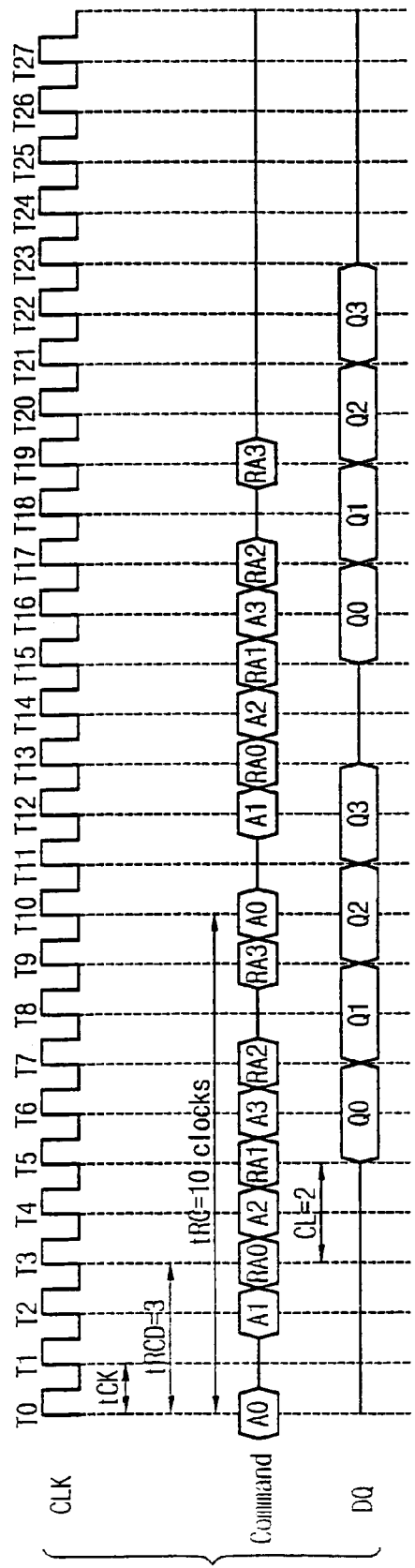
FIG. 1B is a timing diagram showing a conventional read operation that includes an auto-precharge function in a DDR DRAM.

The present invention will now be described more fully with reference to the accompanying drawings, in which typical embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Pursuant to some embodiments of the present invention, semiconductor memory devices are provided that can perform page mode operations while using auto-precharge commands. Operations of the semiconductor devices according to some embodiments of the present invention will now be described for illustrative purposes with respect to a DRAM device that is divided into 4 banks of memory cells. The DRAM performs an auto-precharge function if a specific address bit (e.g., address bit A10) is set to a high level when a read or write command is issued. The DRAM device, however, does not promptly perform the auto-precharge operation after completion of the read or write operation, even though a read or write command with auto-precharge function is input, but instead performs the auto-precharge function after a predetermined delay time. As a result, the device may be able to use a page mode operation together with an auto-precharge read or write command.

Figure 2:
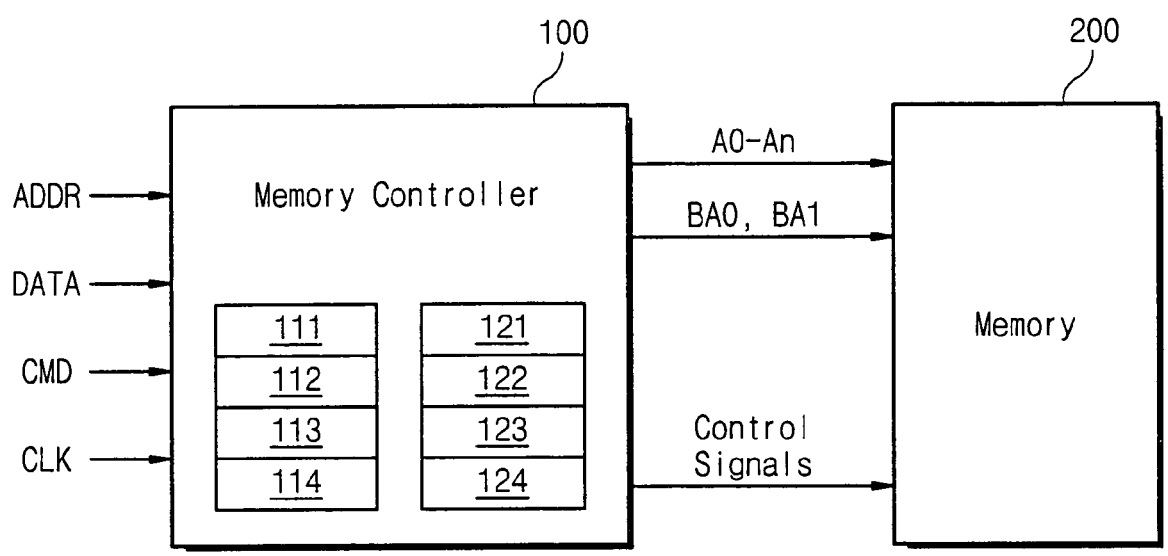
FIG. 2 is a block diagram illustrating a memory system in accordance with some embodiments of the present invention.

FIG. 2 is a block diagram showing a memory system in accordance with some embodiments of the present invention. Referring to FIG. 2, the memory system includes a memory controller 100 and a memory device 200. The memory controller 100 operates the memory device 200 with address signals ADDR, data signals DATA, commands CMD and a clock signal CLK from an external processor. The memory controller 100 includes timers 111–114 and registers 121–124.

Figure 3:
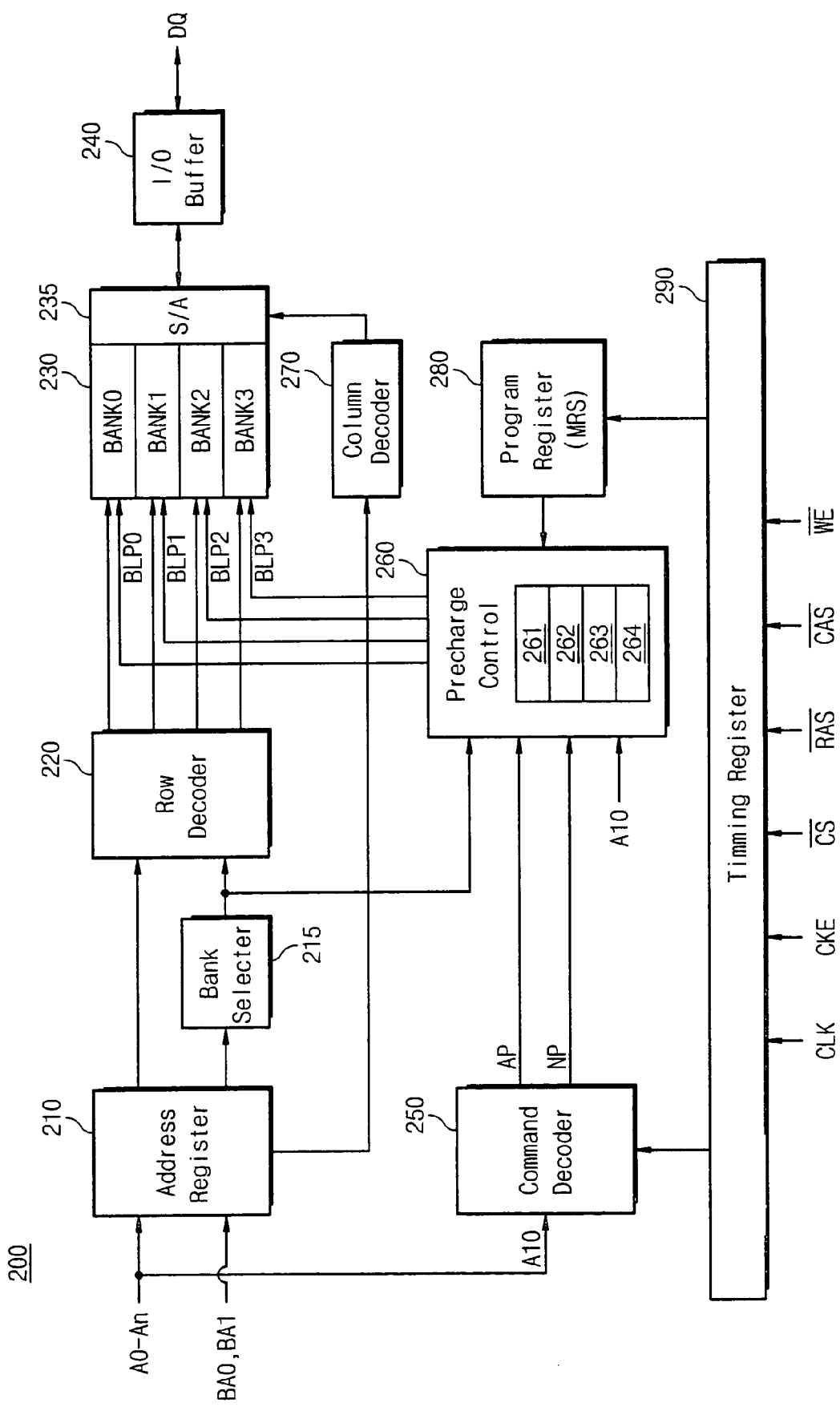
FIG. 3 is a block diagram illustrating a functional structure of the memory device shown in FIG. 2.

An exemplary structure of the memory device 200 is illustrated in FIG. 3. As shown in FIG. 3, the memory device 200 includes an address register 210, a bank selector 215, a row decoder 220, a memory cell array 230, a sense amplifier 235, a data I/O buffer 240, a command decoder 250, a precharge controller 260, a column decoder 270, a program register 280 and a timing resister 290.

The memory cell array 230 illustrated in FIG. 3 is divided into 4 banks BANK0, BANK1, BANK2, and BANK3 and each of the banks includes memory cells arranged in rows and columns. The address register 210 stores address signals A0–An and the bank address signals BA0 and BA1, all of which may be supplied by the memory controller 100. The bank selector 215 responds to the bank address signals BA0 and BA1 stored in the address register 210 by generating a bank selection signal for selecting one of the 4 banks BANK0–BANK3. The row decoder 220 decodes a row address based on the address signals A0–An stored in the address register 210 to generate row selection signals for designating rows of the bank selected by the bank selector 215. The column decoder 270 decodes a column address from the address signals A0–An stored in the address register 210 to generate column selection signals for designating columns of the memory cell array 230.

The sense amplifier 235 detects data stored in a memory cell selected by the row decoder 220 and the column decoder 270. A data bit read-out from the selected memory cell of the array 230 is transferred to the data line DQ through the I/O buffer 240. A data bit received through the data line DQ is written into a selected cell of the memory cell array by way of the I/O buffer 240.

The command decoder 250 generates control signals AP and NP based on the combination of the control signals CLK, CKE, /CS, /RAS, /CAS and /WE that are applied to the timing register 290. The program register (or a mode register set (MRS) circuit) 280 stores information for determining various operation modes of the memory device 200 by logically combining control signals applied to the timing register 290. In some embodiments of the present invention, the program resister 280 stores timing information that specifies when a read or write command with auto-precharge function is generated. The timing information is used for determining the delay time after which the precharge operation will be initiated following input of an active row command.

The precharge controller 260 includes timers 261–264 and responds to the control signals AP and NP provided from the command decoder 250 and the precharge time information stored in the program resistor 280. The precharge controller 260 activates one of precharge control signals BLP0, BLP1, BLP2 and BLP3 in response to the above-described input signals to precharge the one of the banks BANK0–BANK3 which is selected by the bank selector 215.

The memory devices 200 of some embodiments of the present invention may have two precharge operating modes. The first is a normal precharge mode that is performed in response to a precharge command supplied from the memory controller 100. The second is an auto-precharge mode that is performed using read or write commands that include an auto-precharge function. In the normal precharge mode, when control signals /CS, RAS and /WE are low and control signal /CAS is high at the rising edge of the clock signal CK, the command decoder 250 may output the normal precharge signal NP. The precharge command may be used to independently precharge each bank or to simultaneously precharge all of the banks in the normal precharge mode. An address signal A10 and bank address signals BA0 and BA1 are used to specify which bank is precharged when a precharge command is issued. Table 1 shows which banks are precharged for the various possible combinations of the address signal A10 and the bank address signals BA0 and BA1.

TABLE 1

| A10 | BA0 | BA1 | PRECHARGED BANK |
|---|---|---|---|
| LOW | LOW | LOW | BANK0 |
| LOW | LOW | HIGH | BANK1 |
| LOW | HIGH | LOW | BANK2 |
| LOW | HIGH | HIGH | BANK3 |
| HIGH | DON'T CARE | DON'T CARE | BANK0–BANK3 |

As shown in Table 1, when a normal precharge signal NP is activated, the precharge controller 260 activates either one, or all four, of the precharge control signals BLP0–BLP3, based on the combination of the bank selection signals BA0 and BA1 and the address signal A10 from the bank selector 215.

Figure 4:
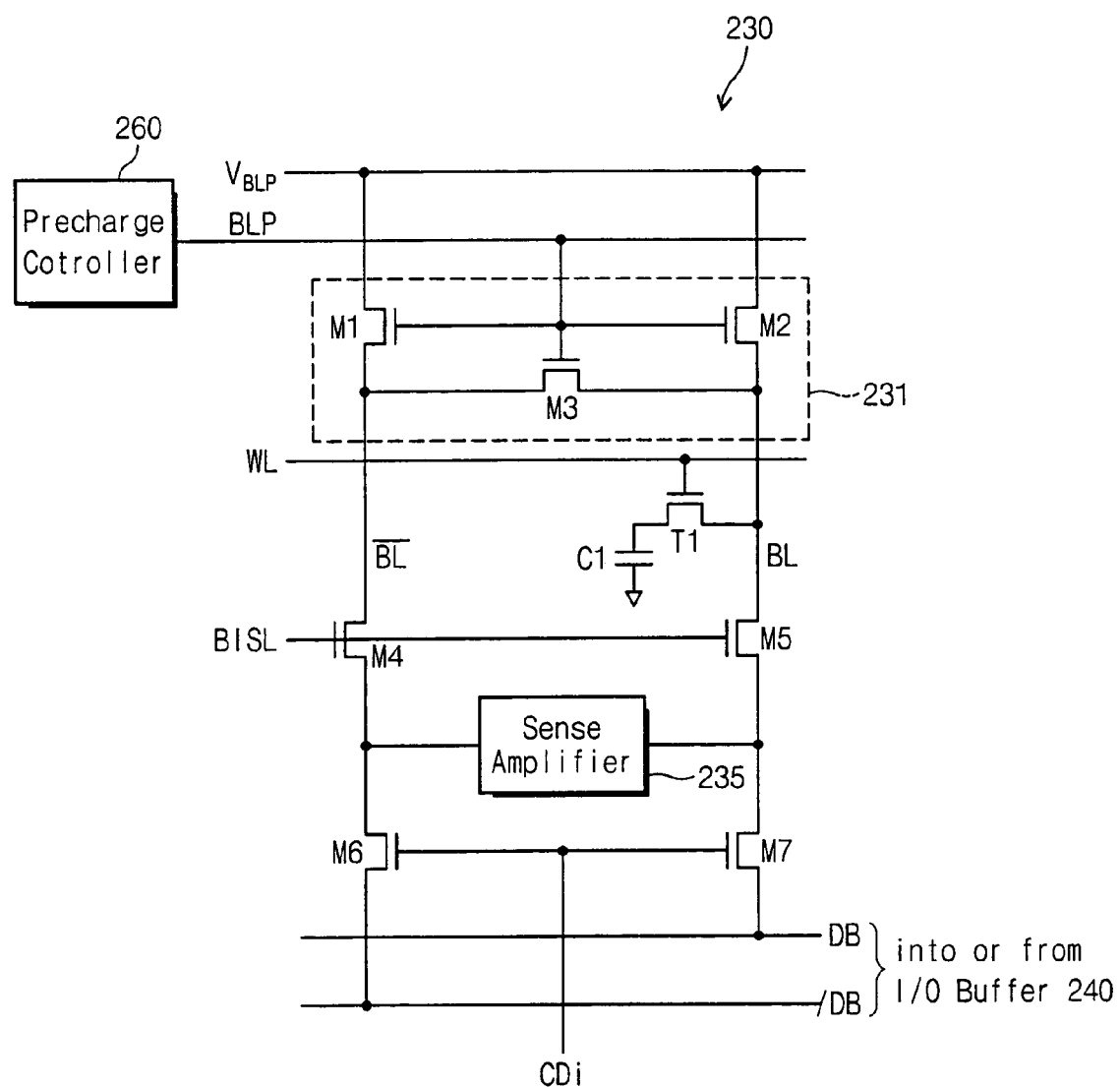
FIG. 4 is a circuit diagram of a partial memory cell array that includes a bit line precharge circuit enabled by a precharge control signal according to some embodiments of the present invention.

FIG. 4 illustrates a portion of the memory cell array 230 and operations for charging bit lines based on precharge control signals according to some embodiments of the present invention. As shown in FIG. 4, the illustrated portion of the memory cell array 230 includes a DRAM memory cell including a transistor T1 and a capacitor C1. The gate of the transistor T1 is connected to a word line WL and the drain of the transistor T1 is connected to a bit line BL or /BL. The capacitor C1 is connected between the source of the transistor T1 and a ground line. The memory cell array 230 further includes a precharge circuit 231 that includes NMOS transistors M1, M2 and M3. The precharge transistor M1 is connected between a precharge voltage $V_{BLP}$ and the bit line /BL and the gate of transistor M1 is connected to a precharge control signal BLP. The equalizing transistor M3 is connected between the bit lines /BL and BL and the gate of transistor M3 is connected to the precharge control signal BLP. When the precharge control signal BLP is activated to a high level, the bit lines /BL and BL are precharged to a precharge voltage $V_{BLP}$ by precharge transistors M1 and M2 and equalized in voltages by the equalizing transistor M3. The precharge voltage $V_{BLP}$, may be, for example, Vcc/2.

Isolation transistors M4 and M5 open the connection between the bit lines /BL and BL and a sense amplifier 235 when an isolation signal BISL is activated to a high level. The sense amplifier 235 senses a voltage difference between the bit lines /BL and BL. Gate transistors M6 and M7 are connected between the bit lines /BL and BL and data lines /DB and DB, respectively. The gates of the gate transistors M6 and M7 are each connected to a row selection signal CDi. In a read mode, data read by the sense amplifier 235 is loaded onto the data lines /DB and DB, respectively, when the gate transistors M6 and M7 are opened by the row selection signal CDi. In the write mode, data on the data lines /DB and DB is written to a memory cell through the bit lines /BL and BL.

Referring again to FIG. 3, an auto-precharge mode will now be further explained. When control signals for an active row command are applied through the timing resistor 290, address signals A0–An and bank address signals BA0 and BA1 are stored in the address register 210. The bank selector 215 selects a specific row of a specific bank corresponding to the address stored in the address resistor 210. If the address signal A10 is set to a low level, a normal read or write operation is performed and the bank remains in an active low state when control signals for the read or write command are introduced thereto. If the address signal A10 is set to a high level, the command decoder 250 activates an auto-precharge control signal AP. The read or write operation may be performed in generally the same way that a conventional read or write operation would be performed. However, the time when the auto-precharge function starts to perform is delayed, for example, until the normal read or write operation is completed.

The precharge controller 260 includes four timers 261–264 corresponding to banks BANK0–BANK3, respectively. The precharge controller 260 resets the timer corresponding to the bank selection signals applied from the bank selector 215 when the auto-precharge signal AP is activated. For example, the timer 261 is reset in the case where the bank selector 215 generates the selection signal that selects bank BANK0. The timer 262 is reset in the case where the selection signal that selects the bank BANK1 is generated. The timer 263 is reset in the case where the selection signal that selects bank BANK2 is generated. The timer 264 is reset in the case where the selection signal that selects bank BANK3 is generated.

As discussed above, a program register 280 stores timing information when a read or write command that includes the auto-precharge function is applied. The timing information may specify when a delay before the memory cell is precharged after input of the active row command. Therefore, the timing information actually stored in the program register 280 may be the precharge delay time $t_{AP}$ minus the time between the input of an active row command and the generation of the auto-precharge control signal AP.

The precharge controller 260 monitors the time values of the timers 261–264 and then generates precharge control signals for precharging the bank that corresponds to the timer reaching the predetermined time specified in the program register 280.

Figure 5A:
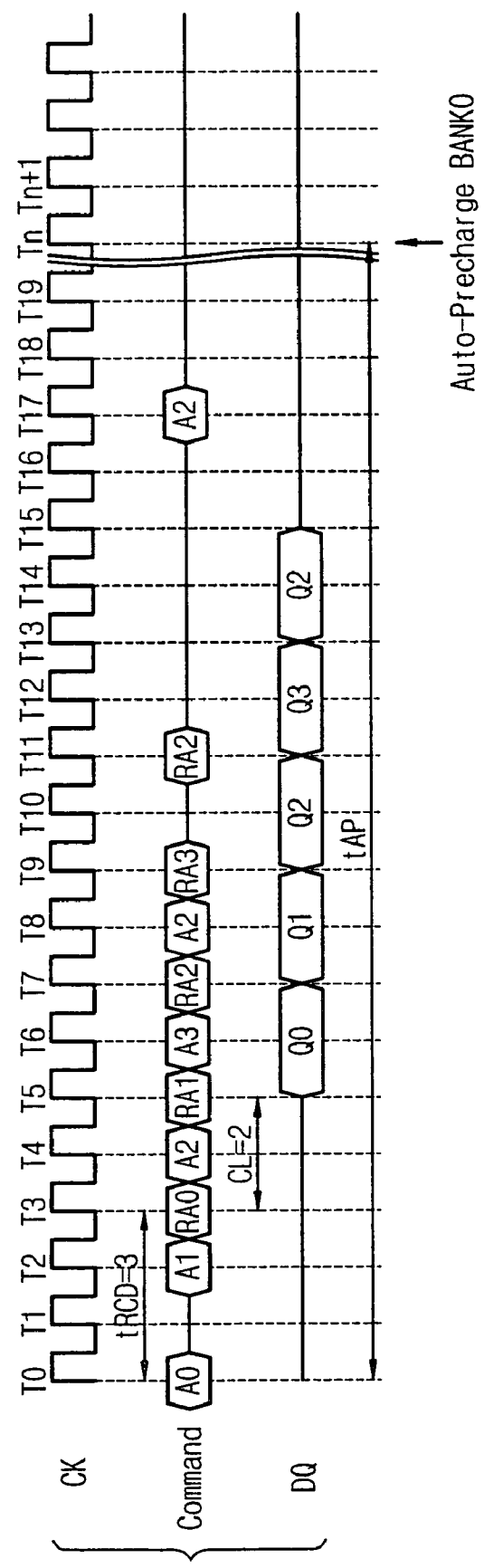
FIG. 5A is a timing diagram illustrating a read operation with an auto-precharge command according to some embodiments of the present invention.

Referring now to FIG. 5A, exemplary operations of the read command with auto-precharge function according to some embodiments of the present invention will now be described. In FIG. 5A, each of first through fourth active row commands A0, A1, A2 and A3, each of first through fourth read commands with auto-precharge function RA0, RA1, RA2 and RA3 and each of first through fourth precharge commands P0, P1, P2 and P3 correspond to one of the four banks, respectively.

As shown in FIG. 5A, the first active row command A0 is introduced at clock cycle T0 and then the first read command with auto-precharge function RA0 is input at clock cycle T3 after $t_{RCD}$. The second active row command A1 is input at clock cycle T2 and then, after $t_{RCD}$, the second read command with auto-precharge function RA1 is input at clock cycle T5. The third active row command A2 is input at clock cycle T4 and the third read command with auto-precharge function RA2 is input after $t_{RCD}$ at clock cycle T7. The fourth active row command A3 is input at clock cycle T6 and, after $t_{RCD}$, the fourth read command with auto-precharge function RA3 is input at clock cycle T9. Two clock cycles (corresponding to CL=2) after the first read command RA0 is introduced, a first data bit Q0 is output to the data I/O signal line DQ at clock cycle T5. Two clock cycles (corresponding to CL=2) after the second read command RA1 is input, a second data bit Q1 is output at clock cycle T7. Similarly, two clock cycles after the third read command RA2 is input, a third data bit Q2 is output at clock cycle T9, and two clock cycles after the fourth read command RA3 is introduced, a fourth data bit Q4 is output at clock cycle T11.

In the embodiments illustrated in FIG. 5A, the first through fourth data bits Q0, Q1, Q2 and Q3 may be output in various bit multiples, for example ×4, ×8, ×16, and ×32, according to the I/O configuration of the memory device 200. In addition, the first through fourth data bits Q0, Q1, Q2 and Q3 may be serially generated at intervals of $t_{RCD}$.

Referring again to FIG. 3, the first active row command A0 is input at clock cycle T0 and then, if the first read command with the auto-precharge function RA0 is input at clock cycle T3, the command decoder 250 activates the auto-precharge control signal AP. The precharge controller 260 responds to the activated auto-precharge control signal AP by resetting the timer 261 corresponding to the bank BANK0. The precharge controller 260 receives timing information from the program register 280 and activates the precharge control signal BLP0 (for precharging the bank BANK0, which is the bank selected by the bank selection signal from the bank selector 215) if the timer 261 reaches auto-precharge delay time $t_{AP}$. If the precharge control signal BLP0 is activated, the bit lines for the bank BANK0 are precharged to, for example, Vcc/2.

If the read or write command with auto-precharge function for accessing an identical row of the bank BANK0 is input before the timer 261 reaches the auto-precharge delay time $t_{AP}$, the auto-precharge control signal AP is activated by the command decoder 250. This acts to reset the timer 261. If, instead, a normal read or write command for accessing an identical row of the bank BANK0 is input before the timer 261 reaches the auto-precharge delay time $t_{AP}$, the bank is precharged when the auto-precharge delay time $t_{AP}$ passes from the time the last read or write command with auto-precharge function was input.

Referring to FIG. 2 again, each of the timers 111 through 114 and each of the resisters 121 through 124 correspond to the banks BANK0–BANK3, respectively. If the externally received command CMD is a read or write command that includes the auto-precharge function, one of the timers 111 through 114 is reset according to the bank address signals BA0 and BA1. When the read or write command that includes the auto-precharge function is issued, a row address of address signal ADDR is stored in one of registers 121 through 124 according to the bank address signals BA0 and BA1. For example, when the read or write command that includes the auto-precharge function is input, the timer 111 is reset and the row address of the address signals ADDR is stored in the address register 121 if the bank address signals BA0 and BA1 select bank BANK0. Likewise, when the read or write command that includes the auto-precharge function is input, the timer 112 is reset and the address signal ADDR is stored in the register 122 if the bank address signals BA0 and BA1 select bank BANK1.

EXAMPLE

When the auto-precharge command for reading data stored in a row address i and a column address j of bank BANK0 is input into the memory controller 100, the memory controller 100 and the memory device 200 may operate as follows. First, the memory controller 100 resets a timer 111 corresponding to the bank BANK0, and stores the row address i in the register 121. As illustrated in FIG. 5A, the first active row command A0 is issued to the memory device 200 from the memory controller 100 at clock cycle T0. A read command that includes the auto-precharge function is input at clock cycle T3 and a data bit Q0 is output at clock cycle T5. If there is no input data for accessing the row address i during an auto-precharge delay time $t_{AP}$, the memory controller 100 stops the timer 111 and deletes the row address stored in the register 121 and the precharge controller 260 outputs the precharge control signal BLP0 for precharging the bank BANK0 and stops the timer 261. In some embodiments, $t_{RCD}$ is set to 3 clock cycles and the time when the memory controller 100 stops the timer 111 and deletes the row address stored in the register 121 is when the timer 111 has the value of "auto-precharge delay time $t_{AP}$–$t_{RCD}$". In such embodiments, this is because the timer 111 is not reset until the read command with auto-precharge function RA0 is introduced thereto. When the timer 261 reaches the time stored in the program register 280, the precharge controller 260 outputs the precharge control signal BLPO and stops the timer 261.

For such embodiments, even if a read or write command that includes the auto-precharge function is input, the precharge operation is not carried out during the precharge delay time $t_{AP}$ after a read or write operation. Thus, the page mode may be available. However, if the read or write command for accessing the same row address of the same bank is not introduced during the precharge delay time $t_{AP}$, the probability that a later input read or write command will be directed to the identical row address of the identical bank is relatively low, and, hence, the precharge operation may be performed automatically. If the read or write command input while the page is opened does not relate to the opened page but to another page, the read or write operation may be performed in the order of "precharge-active row-read or write." That is, an access latency may increase as long as the precharge time $t_{RP}$. Therefore, the precharge delay time $t_{AP}$ may be determined considering this increase of the latency.

Figure 5B:
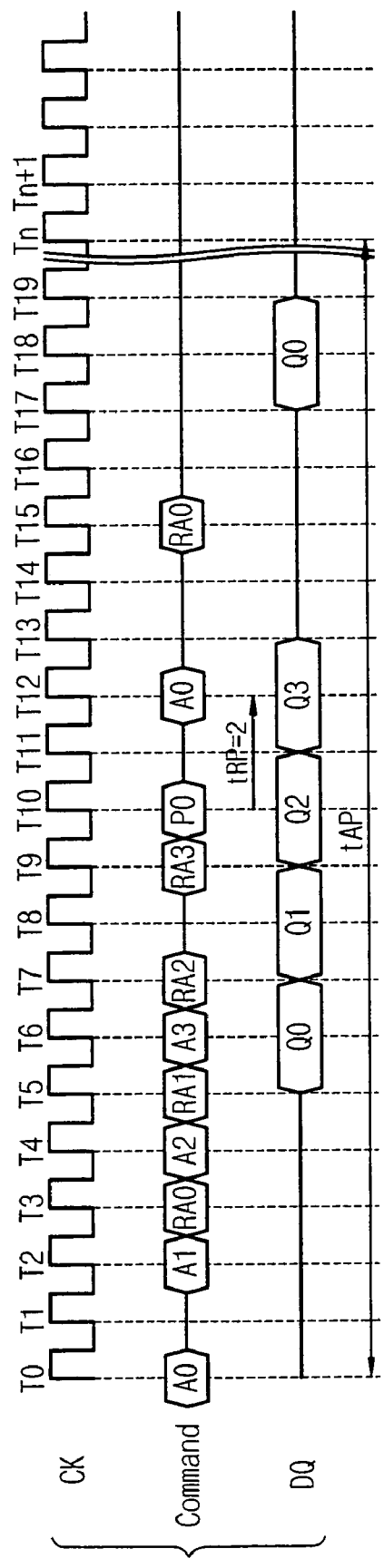
FIG. 5B is timing diagram showing a read operation according to some embodiments of the present invention where a command to access a bank is introduced while the bank is open.

FIG. 5B is a timing diagram showing a read operation when a command for accessing another row of the bank BANK0 is issued while row address i of bank BANK0 is open according to some embodiments of the present invention. At clock cycle T0, a first active row command A0 for opening a row address i of the bank BANK0 is input, and a read command that includes an auto-precharge function is issued at clock cycle T3. Then, the bank BANK0 may be precharged to input the row address i of the bank BANK0. The memory controller 100 outputs a first precharge command P0 at clock cycle T10 in order to precharge the bank BANK0 if a read command directed to a different row address of bank BANK0 is input. In addition, the memory controller 100 stops a timer 111 and then erases the row address stored in the register 121. Meanwhile, a command decoder 250 of the memory controller 100 responds to the first precharge command P0 to output a normal precharge signal NP and stops the timer 261 corresponding to the bank BANK0. When the precharge time $t_{RP}$ is 2 clock cycles, the first active row command A0 may be introduced for opening the row address i of the bank BANK0 and the read command with auto-precharge function RA0 may be input at clock cycle T15, thereby outputting a data bit Q0 at clock cycle T17.

According to some embodiments of the present invention, when a read or write command that includes the auto-precharge function is applied, the read or write command is performed first and then an auto-precharge operation is performed after a selected auto-precharge delay time passes. Thus, page mode operation may be carried out while using read or write commands that include the auto-precharge function. As a result, the operation latency of the device may be decreased, thereby improving the performance of the memory device.

While the present invention has been described in connection with specific and preferred embodiments thereof, it will be understood by those of skill in the art that various changes and modifications may be made therein without departing from the spirit and scope of the invention. It should be appreciated that the scope of the invention is not limited to the detailed description of the invention hereinabove, which is intended merely to be illustrative, but rather comprehends the subject matter defined by the following claims and equivalents.

What is claimed is:

1. A method of precharging a semiconductor memory device, the method comprising:
    receiving a command that includes an auto-precharge function for a bank of memory cells in the semiconductor memory device;
    performing the command except for the auto-precharge function;
    initiating a timer in response to the received command; and
    performing the auto-precharge function for automatically precharging the bank of memory cells responsive to the timer reaching a predetermined value.

2. The method of claim 1, wherein the received command is associated with data stored in a specific row of the bank of memory cells, and wherein the method further comprises resetting the timer when prior to the timer reaching the predetermined value a second command is received by the semiconductor memory device that is associated with additional data stored in the specific row of the bank of memory cells.

3. The method of claim 1, wherein the received command is associated with data stored in a specific row of the bank of memory cells, and wherein the method further comprises precharging the bank of memory cells when prior to the timer reaching the predetermined value a second command is received by the semiconductor memory device that is associated with data stored in a different row of the bank of memory cells.

4. The method of claim 1, wherein the received command is associated with data stored in a specific row of the bank of memory cells, and wherein the specific row of the bank of memory cells is left open for a period of time after an operation associated with the command is completed.

5. The method of claim 4, wherein the received command is a first read command, and wherein the method further comprises performing a first read operation in response to the first read command and performing a second read operation after completion of the first read operation using a page mode operation.

6. The method of claim 1, the method further comprising initiating a second timer in response to the received command and storing a row address associated with the received command.

7. A semiconductor memory device, comprising:
a memory cell array arranged in rows and columns; and
a precharge control circuit having at least one timer, wherein the precharge control circuit is configured to issue a precharge control signal to the memory cell array responsive to receipt of a command that includes an auto-precharge function a predetermined time after the command is received.

8. The semiconductor memory device of claim 7, wherein the precharge control circuit issues an auto-precharge control signal to the memory cell array responsive to the at least one timer reaching the predetermined time.

9. The semiconductor memory device of claim 8, further comprising a storage device that stores the predetermined time.

10. The semiconductor memory device of claim 9, wherein the semiconductor memory device further comprises a second timer that measures passage of the predetermined auto-precharge time and a row address storage register that is associated with the second timer.

11. The semiconductor memory device of claim 7, further comprising a row decoder for decoding an externally received row address and a command decoder that activates an auto-precharge control signal in response to the input of a command having the auto-precharge function.

12. A method of precharging a bank of memory cells in a semiconductor memory device, the method comprising:
receiving at the semiconductor memory device a read command that includes an auto-precharge function;
starting a timer to receiving the received read command;
performing a read operation responsive to the received read command;
delaying initiation of an auto-precharge operation called for by the auto-precharge function until the timer reaches a predetermined time.

13. A semiconductor memory device comprising:
a memory cell array disposed in rows and columns;
a row decoder for decoding an externally received row address;
a command decoder for decoding externally received commands and activating an auto-precharge control signal when a decoded command includes an auto-precharge function; and
a precharge control circuit that includes at least one timer that is reset in response to the auto-precharge control signal and that initiates precharging of at least a part of the memory cell array when the at least one timer reaches a predetermined value.

14. The semiconductor memory device of claim 13, further comprising a program register that stores timing information about when the at least part of the memory cell array is precharged.

15. The semiconductor memory device of claim 14, wherein the precharge control circuit causes the memory cell array to be precharged when the timer reaches a value of the timing information stored in the program register.

16. The semiconductor memory device of claim 15, wherein the program register is a mode register set.

17. The semiconductor memory device of claim 13, wherein the memory device is a DRAM device.

18. A semiconductor memory device comprising:
a plurality of banks having a plurality of memory cells disposed in rows and columns;
a bank selector for selecting one of the banks in response to an externally received bank address;
a row selector for selecting one row of the selected bank in response to an externally received row address;
a command decoder for decoding a externally received command and activating an auto-precharge control signal when the decoded command has an auto-precharge function; and
a precharge control circuit that includes a plurality of timers corresponding to the plurality of banks, respectively,
wherein the timer corresponding to the selected bank is reset in response to the auto-precharge control signal, and controls the bank to be precharged when the timer reaches a predetermined value.

19. The semiconductor memory device of claim 18, further comprising a program register that stores timing information regarding when the selected bank is precharged.

20. The semiconductor memory device of claim 19, wherein the precharge control circuit causes the selected bank to be precharged when the timer reaches a value of the timing information stored in the program register.

21. The semiconductor memory device of claim 19, wherein the program register is mode register set.

* * * * *

UNITED STATES PATENT AND TRADEMARK OFFICE
CERTIFICATE OF CORRECTION

| | | |
|---|---|---|
| PATENT NO. | : 7,057,950 B2 | Page 1 of 1 |
| APPLICATION NO. | : 10/706891 | |
| DATED | : June 6, 2006 | |
| INVENTOR(S) | : Lee | |

It is certified that error appears in the above-identified patent and that said Letters Patent is hereby corrected as shown below:

<u>Column 11</u>,
Line 58 should read -- starting a timer responsive to receiving the received read command; --

Signed and Sealed this

Thirty-first Day of October, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,057,950 B2 | Page 1 of 1 |
| APPLICATION NO. | : 10/706891 | |
| DATED | : June 6, 2006 | |
| INVENTOR(S) | : Lee | |

It is certified that error appears in the above-identified patent and that said Letters Patent is hereby corrected as shown below:

Column 11,
Line 56 should read -- starting a timer responsive to receiving the received read command; --

This certificate supersedes Certificate of Correction issued October 31, 2006.

Signed and Sealed this

Ninth Day of January, 2007

JON W. DUDAS
*Director of the United States Patent and Trademark Office*